(12) United States Patent
Yeh

(10) Patent No.: US 9,349,886 B2
(45) Date of Patent: May 24, 2016

(54) SOLAR SUBSTRATE WITH HIGH FRACTURE STRENGTH

(75) Inventor: Jer-Liang Yeh, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 13/366,444

(22) Filed: Feb. 6, 2012

(65) Prior Publication Data

US 2012/0204944 A1 Aug. 16, 2012

(30) Foreign Application Priority Data

Feb. 10, 2011 (TW) ................................ 100104420

(51) Int. Cl.
| | | |
|---|---|---|
| H01L 31/044 | (2014.01) | |
| H01L 31/0236 | (2006.01) | |
| H01L 31/0352 | (2006.01) | |
| H01L 21/02 | (2006.01) | |

(52) U.S. Cl.
CPC .. *H01L 31/02363* (2013.01); *H01L 31/035281* (2013.01); *H01L 21/0237* (2013.01); *H01L 21/0243* (2013.01); *H01L 21/02381* (2013.01); *Y02E 10/50* (2013.01)

(58) Field of Classification Search
CPC ........ H01L 31/00–31/078; Y02E 10/50–10/60
USPC ................................................. 136/243–265
See application file for complete search history.

(56) References Cited

U.S. PATENT DOCUMENTS

2001/0029977 A1* 10/2001 Oya .............................. 136/256
2010/0035022 A1* 2/2010 Yeh .............................. 428/141

FOREIGN PATENT DOCUMENTS

| EP | 0933822 | 8/1999 |
|---|---|---|
| TW | 201007892 A | 8/1997 |

OTHER PUBLICATIONS

TW Office Action mailed Oct. 23, 2013 for TW Application No. 1022143648001.
Office Action for CN 201110045897.6 mailed Mar. 5, 2014.
English translation of the abstract for TW 201007892A filed Aug. 6, 1997.

* cited by examiner

*Primary Examiner* — Bach Dinh
(74) *Attorney, Agent, or Firm* — Thomas | Horstemeyer, LLP

(57) ABSTRACT

The invention discloses a solar substrate with high fracture strength. The solar substrate according to the invention comprises an upper surface, a plurality of first protrusions and a plurality of first recess regions. The first protrusions are formed on the upper surface and each of the plurality of first recess regions being formed on the surrounding of the plurality of first protrusions, such that the deflection required to crack the solar substrate by bending thereto being increased in comparison with the solar substrate without the plurality of first protrusions and first recess regions formed thereon. By the combination of the protrusions and the recess regions, the fracture strength of the solar substrate is enhanced for enduring a high tension.

12 Claims, 7 Drawing Sheets

| silicon substrate with [100] crystallographic orientation | | |
|---|---|---|
| surface type | stress intensity ($10^8$Pa) | Young's modulus (1011Pa) |
| non-nano strcture | 2.2 ± 0.4 | 1.64±0.07 |
| nano strcture | 4.5 ± 1.1 | 1.65±0.05 |

FIG.5A

| silicon substrate with [111] crystallographic orientation | |
|---|---|
| surface type | fracture strength ($10^8$Pa) |
| non-nano strcture | 2.6 ± 0.9 |
| nano strcture | 4.3 ± 0.2 |

FIG.5B

SOLAR SUBSTRATE WITH HIGH FRACTURE STRENGTH

CROSS-REFERENCE TO RELATED APPLICATION

This application claims priority to Taiwan Application Serial Number 100104420, filed Feb. 10, 2011, which is incorporated herein by reference.

BACKGROUND OF THE INVENTION

1. Field of the Invention

The present invention relates to a solar substrate. More particularly, the present invention relates to a solar substrate with high fracture strength.

2. Description of the Prior Art

Generally, silicon wafers are used as substrates for solar cells in prior art. However, the silicon wafers are brittle materials so that the silicon wafers are fractured easily by external forces in a manufacturing process. Besides for the solar cells, the silicon wafers are usually used for manufacturing semiconductor devices. Additionally, because the demand of the semiconductor devices increases, the demand of silicon material increases correspondingly. Thus, how to avoid the waste of the silicon material (fractured by the external forces) or increase yield of the manufacturing process becomes an important issue. Take the solar cells for example, if the solar cells comprise the substrates with high fracture strength, the possibility of fracturing will be decreased.

Please refer to FIG. 1A and FIG. 1B. FIG. 1A and FIG. 1B illustrate images taken in a process of testing a silicon wafer with high fracture strength in the prior art. The silicon wafers are made by single-crystal silicon substrates. When the silicon wafers are forced by a stress, the stress will concentrate on the local area of the silicon wafers. If the stress is increased gradually, cracks will be produced at the local area of the silicon wafers and the crack propagation becomes obvious. Finally, the silicon wafers are fractured into several pieces (as shown in FIG. 1B).

In prior art, if the silicon wafers are forced by the stress, the stress will concentrate on the local area of the silicon wafers. If the stress can be distributed averagely, the fracture strength of the silicon wafers will be enhanced. To sum up, it is an important issue to develop a solar substrate for solving the said problem.

SUMMARY OF THE INVENTION

Accordingly, a scope of the invention is to provide a solar substrate with high fracture strength. According to an embodiment of the invention, the solar substrate with high fracture strength comprises an upper surface, a plurality of first protrusions and a plurality of first recess regions. The plurality of first protrusions are formed on the upper surface. Each of the plurality of first recess regions is formed on the surrounding of the plurality of first protrusions, such that the deflection required to crack the solar substrate by bending being increased, for about 30%~50%, in comparison with the solar substrate without the plurality of first protrusions and first recess regions formed thereon. Due to the first protrusions and the first recess regions, the fracture strength of the solar substrate is increased or enhanced so as to endure a high tension. Additionally, the upper surface is under tension. Furthermore, the solar substrate may be an amorphous substrate, a single-crystal substrate or a polycrystalline substrate. The single-crystal substrate can also be a single-crystal silicon substrate. The first protrusions can be a plurality of nano pillars or a plurality of nano needles. Wherein, the top distances of the neighbor nano pillars or the nano needles range from about 10 nm to 100 nm.

Furthermore, the solar substrate may also made of glass, silicon, germanium, carbon, aluminum, gallium nitride, gallium arsenide, gallium phosphide, aluminum nitride, sapphire, spinel, aluminum oxide, silicon carbide, zinc oxide, magnesium oxide, lithium aluminum dioxide or lithium gallium dioxide.

According to another embodiment of the invention, the solar substrate with high fracture strength further comprises a lower surface, under compression. The lower surface has a plurality of second protrusion and a plurality of second recess regions formed thereon, each of the plurality of second recess regions being formed on the surrounding of the plurality of second protrusions.

Meanwhile, the solar substrate may be a p-type semiconductor layer having an n-type semiconductor layer formed thereon. Furthermore, the solar substrate may also has a first micro structure layer formed between the upper surface and the plurality of first protrusions and a second micro structure layer may be formed between the lower surface and the plurality of second protrusion.

Moreover, the present invention also teaches a method for increasing the fracture strength of a solar substrate, comprising the steps of preparing a solar substrate, the solar substrate having a upper surface and a lower surface, the upper surface being under tension and the lower surface being under depression; forming a plurality of first protrusions on the upper surface of the solar substrate; and forming a plurality of first recess regions on the upper surface of the solar substrate, each of the plurality of first recess regions being formed on the surrounding of the plurality of first protrusions.

To sum up, the invention is to provide the solar substrate with high fracture strength. Due to the first protrusions and first recess regions, the solar substrate can endure a greater stress applied thereto and increase the fracture strength to avoid fracturing in subsequent process.

BRIEF DESCRIPTION OF THE APPENDED DRAWINGS

FIG. 5A and FIG. 5B illustrate test data produced in a process of testing a solar substrate with high fracture strength according to the invention.

DETAILED DESCRIPTION OF THE INVENTION

Figure 2A:
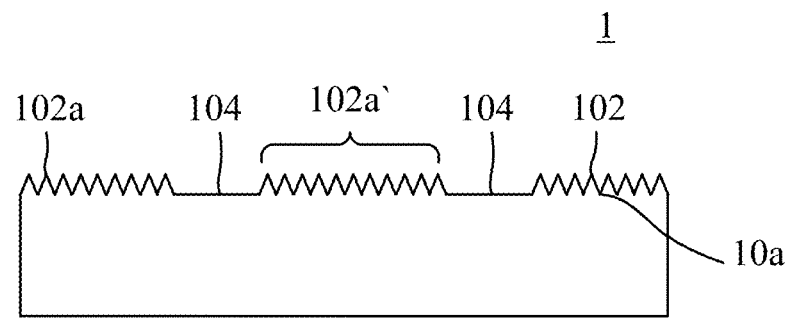
FIG. 2A illustrates a cross sectional view of a solar substrate according to an embodiment of the invention.

Please refer to FIG. 2A. FIG. 2A illustrates a cross sectional view of a solar substrate according to an embodiment of the invention. As shown in FIG. 2A, a solar substrate 1 comprises an upper surface 10a, a plurality of first protrusions 102 and a plurality of first recess regions 104. Wherein, each first protrusion pattern 102 is formed on the upper surface 10a, the first protrusions 102 are surrounded by each first recess region 104. Each element will be explained in detail as follows.

The solar substrate 1 may be an amorphous substrate, a single-crystal substrate or a polycrystalline substrate. In practice, the solar substrate 1 s=is usually formed by a silicon based semiconductor substrate, such as an amorphous silicon substrate, a single-crystal silicon substrate or a polycrystalline silicon substrate. However, the substrate of the solar substrate 1 can be, but not limited to a silicon substrate. For example, the invention of the solar substrate 1 can be, but not limited to be, manufactured by glass (SiO2), silicon (Si), germanium (Ge), carbon (C), aluminum (Al), gallium nitride (GaN), gallium arsenide (GaAs), gallium phosphide (GaP), aluminum nitride (AlN), sapphire, spinel, aluminum oxide (Al2O3), silicon carbide (SiC), zinc oxide (ZnO), magnesium oxide (MgO), lithium aluminum dioxide (LiAlO2) or lithium gallium dioxide (LiGaO2). Additionally, the solar substrate 1 can be a p-type semiconductor layer having an n-type semiconductor layer formed thereon so as to form a solar cell.

Additionally, in the present embodiment, the upper surface 10a can be defined as a tension bearing surface of the solar substrate 1 or the surface of the solar substrate 1 which is under tension. More specifically, while a force is applied on a lateral surface of the solar substrate 1, the tension bearing surface deforms outward. Meanwhile, the surface of the solar substrate 1 which is opposite to the tension bearing surface is under compression and deforms inward correspondingly. In the present embodiment, the surface under compression is defined as the lower surface. In practice, because of the said unique structures formed on the solar substrate 1, the fracture strength of the solar cell manufactured thereby can be enhanced or increased significantly. It worth a mention that in another embodiment, the upper surface 10a of the solar substrate can also be defined as any other surface of the solar substrate 1 which is capable of increasing the fracture strength thereof by forming the said structures thereon.

Figure 2B:
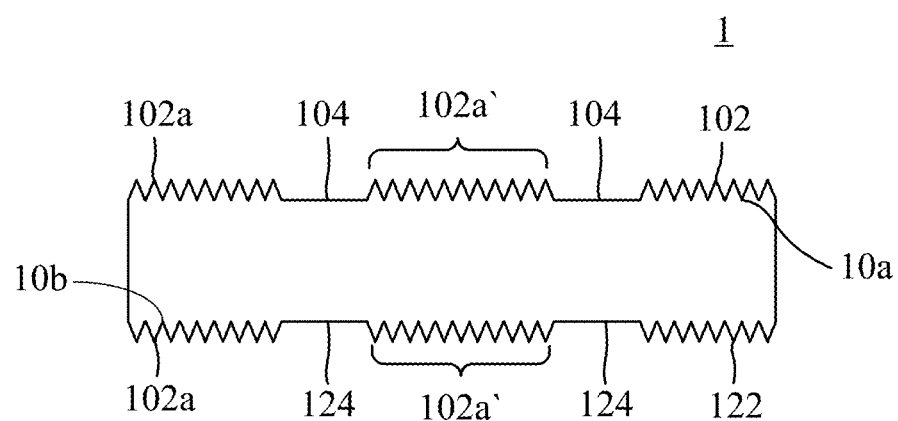
FIG. 2B illustrates a cross sectional view of a solar substrate according to another embodiment of the invention.

Please refer to FIG. 2B. FIG. 2B illustrates a cross sectional view of a solar substrate according to another embodiment of the invention. As shown in FIG. 2B, the solar substrate 1 further has a lower surface 10b, a plurality of second protrusion 122 and a plurality of second recess regions 124. The plurality of second protrusion 122 are surrounded by each second recess region 124. More specifically, each of the plurality of second recess regions is formed on the surrounding of the plurality of second protrusions. Again, the lower surface 10b can be defined as the surface of the solar substrate 1 under compression. In practice, the thickness or the height of the first protrusions 102 and the second protrusions 122 form on upper surface 10a and lower surface 10b are approximately the same due to the same manufacturing process thereof.

From the microscopic structure, the first protrusions 102 further comprise a plurality of nanostructures. The plurality of nanostructures can enhance the fracture strength of the solar substrate 1 with the first recess region 104. More specifically, each of the plurality of first protrusions 102 or second protrusions 122 may further comprises a plurality of nanostructures formed thereon, by collocating the nanostructures with the recess regions of the solar substrate 1, the fracture strength increasing effect thereof can be further enhanced.

Figure 2C:
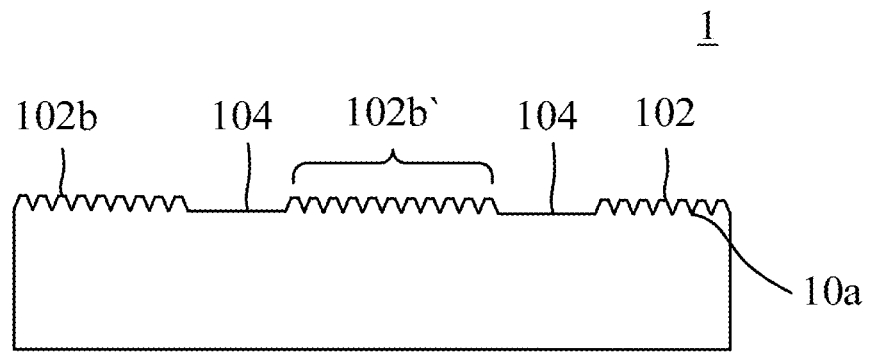
FIG. 2C illustrates a cross sectional view of a solar substrate according to another embodiment of the invention.
Figure 2D:
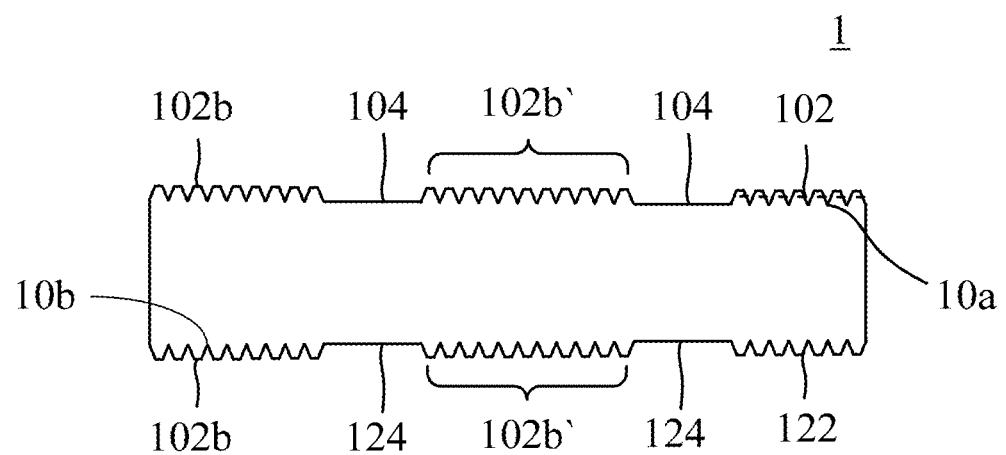
FIG. 2D illustrates a cross sectional view of a solar substrate according to another embodiment of the invention.

Please refer to FIG. 2A to FIG. 2D. FIG. 2C illustrates a cross sectional view of a solar substrate according to another embodiment of the invention. FIG. 2D illustrates a cross sectional view of a solar substrate according to another embodiment of the invention. As shown in figures, the first protrusions 102 can be the plurality of nanostructures. A plurality of nano needles in FIG. 2A and a plurality of nano pillars can be formed by the plurality of nanostructures. To be noticed, the solar substrate 1 comprises the upper surface 10a, and the plurality of nano pillars 102b are formed by etching the upper surface 10a downward in an etching process. The etching process can be an electrochemical etching process. Additionally, the plurality of nano needles 102a or the nano pillars 102b can be, but not limited to be formed singly, the plurality of nano needles 102a and the nano pillars 102b can be formed at the same time.

Furthermore, the plurality of nano needles 102a or nano pillars 102b can be connected with each other to form a group of nano needles 102a' or nano pillars 102b'. Wherein, the top distances of the neighbor nano pillars 102b or the nano needles 102a range from about 10 nm to 100 nm. The height of each nano needle 102a or each nano pillar 102b is at micron scale. An aspect ratio R1 is defined as a ratio of neighbor distance to height of the nano pillars 102b or the nano needles 102a. The aspect ratio R1 is determined by etching parameters, such as etching time and etching temperature. According to the experiment results, the aspect ratio R1 can be larger than 1.5. In a preferred embodiment, the aspect ratio R ranges from 2 to 4.

That is to say, the plurality of nano needles 102a or nano pillars 102b are formed on the upper surface 10a, so that the materials of the nano needles 102a, nano pillars 102b and the solar substrate 1 can be the same. In an embodiment, if the solar substrate 1 is a single-crystal silicon substrate, the crystallographic orientation of the upper surface 10a can be [100] or [111]. By forming the plurality of nano needles 102a or nano pillars 102b, the fracture strength of the solar substrate 1 can be enhanced. To be noticed, if the solar substrate 1 is formed by different multilayered materials, the nano needles 102a or nano pillars 102b can be other proper materials for the solar cells.

Please refer to FIG. 2B and FIG. 2D, the second protrusion 122 of the lower surface 10b can be a plurality of nanostructures. The shapes of the plurality of nanostructures can be a plurality of nano needles (nanotip) 102a in FIG. 2A or the nano pillars (nanorod) 102b in FIG. 2D. In comparison with the nanostructures in FIG. 2A and in FIG. 2C, the embodiment in FIG. 2B and in FIG. 2D can further enhance the fracture strength about 15% of the solar substrate 1. That is to say, if both of the upper surface and the lower surface of the solar substrate 1 has the nanostructures previously described formed thereon, the solar substrate 1 can endure greater force or stress. More specifically, the deflection required to crack the solar substrate by bending is increased in comparison with the solar substrate without the plurality of first protrusions 102 and first recess regions 104 formed thereon.

Figure 3:
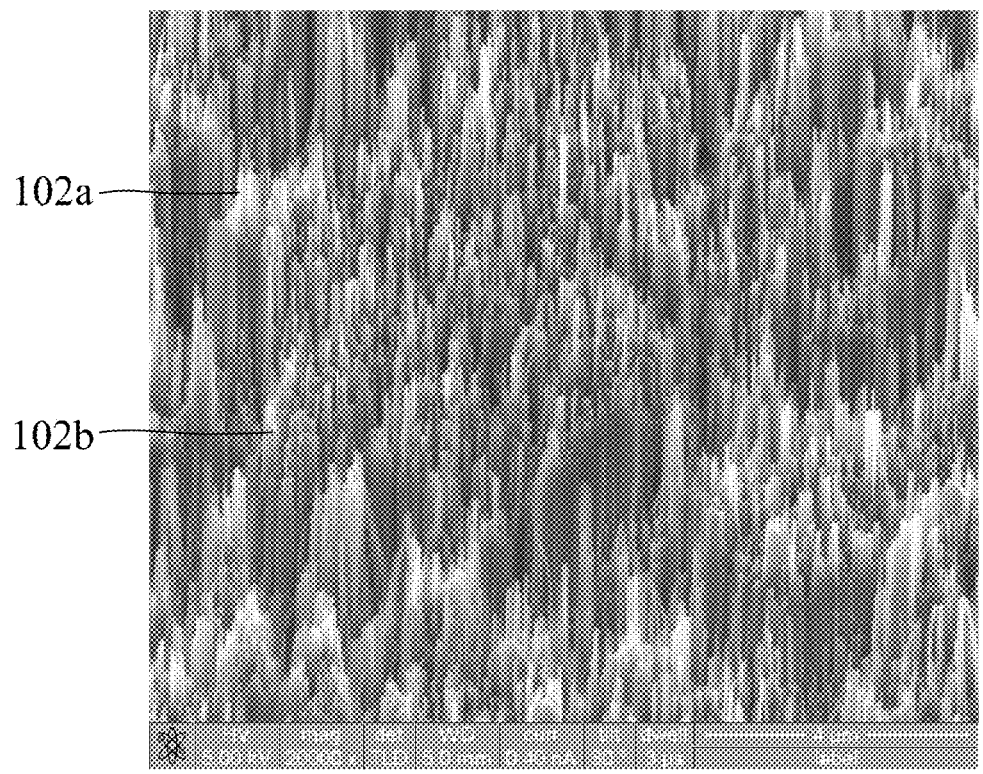
FIG. 3 illustrates an exterior image of first protrusions of a solar substrate according to the invention.

Please refer to FIG. 3. FIG. 3 illustrates an exterior image of first protrusions of a solar substrate according to the invention. The plurality of first protrusions 102 can be the nano needles 102a and nano pillars 102b formed densely on the upper surface 10a. To be noticed, the nano needles 102a and nano pillars 102b also can be formed regularly or irregularly on the upper surface 10a. In practice, the nano needles 102a and nano pillars 102b a can be formed by the electrochemical etching process.

Additionally, the invention of the solar substrate 1 can further comprises a first micro structure layer and a second micro structure layer (not shown in figures). The first micro structure layer can be formed between the upper surface 10a and the plurality of first protrusions 102. The second micro structure layer is formed between the lower surface 10b and the plurality of second protrusion 122.

Figure 4A:
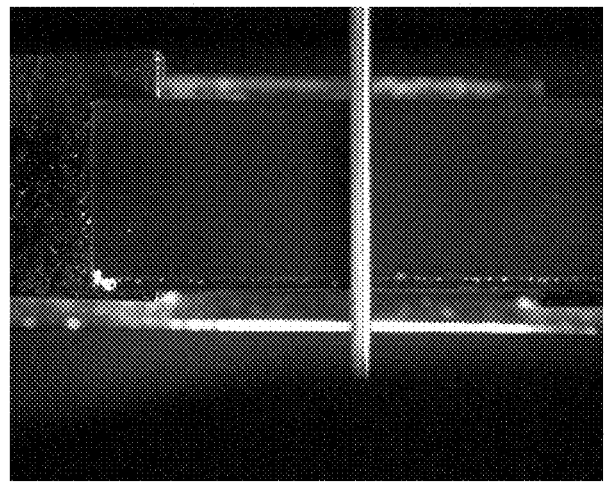
FIG. 4A and FIG. 4B illustrate images taken in a process of testing a solar substrate with high fracture strength according to the invention.
Figure 4B:
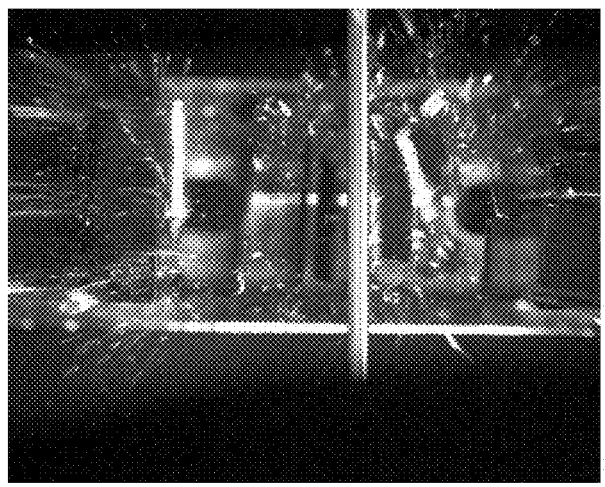

The fracture strength of the solar substrate 1 can be tested by a three-point bending strength process. Please refer to FIG. 4A and FIG. 4B. FIG. 4A and FIG. 4B illustrate images taken in a process of testing a solar substrate with high fracture strength according to the invention. In the process, the solar substrate is a single-crystal silicon with [100] or [111] crystallographic orientation.

Figure 1A:
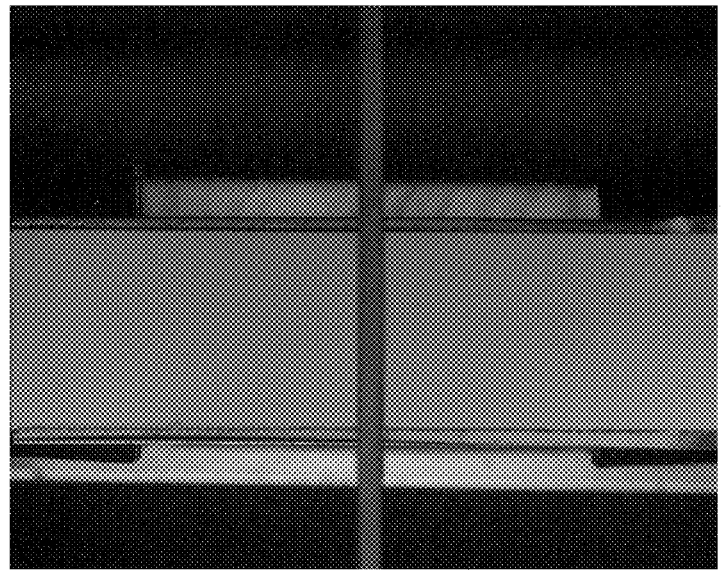
FIG. 1A and FIG. 1B illustrate images taken in a process of testing a silicon wafer with high fracture strength in the prior art.
Figure 1B:

As shown in FIG. 4A and FIG. 4B, if the load exceeds the limit, the solar substrate cracks or fractures. The phenomenon indicates that the solar substrate absorbs a lot of energy and fractures. Just like the comparison between the bulletproof glass and the general glass, the fracture strength of the solar substrate in the FIG. 4A and FIG. 4B is better than the in the FIG. 1A and FIG. 1B.

Please refer to FIG. 5A and FIG. 5B. FIG. 5A and FIG. 5B illustrate test data produced in a process of testing a solar substrate with high fracture strength according to the invention. The solar substrate is a single-crystal silicon with [100] or [111] crystallographic orientation. To be noticed, when the solar substrate load a stress, the fracture always occurs on the tension bearing surface and extends toward other place. Thus, the invention tests the fracture strength on the tension bearing surface.

As shown in FIG. 5A and FIG. 5B, the fracture strength will be enhanced no matter the crystallographic orientation of the single-crystal silicon is either [100] or [111]. That is to say, the fracture strength of the solar substrate in the invention is actually better than the solar substrate in the prior art with no protrusions and recess regions formed thereon. Additionally, the Young's modulus of the two solar substrates is almost the same. Accordingly, the fracture strength of the solar substrate can be enhanced by forming the nanostructures without changing the materials.

The structures of the first protrusions 102, second protrusions, first recess regions 104 and second recess regions 124 are formed on the upper surface or the lower surface of the solar substrate 1 so as to enhance that fracture strength thereof. More specifically, while a stress is applied to the solar substrate of the present invention, instead of concentrating the stress in the particular section, the stress shall be distributed averagely to the recess regions.

Figure 6A:
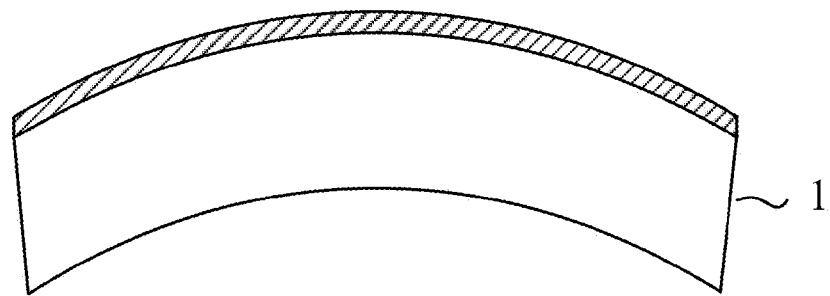
FIG. 6A illustrates a cross sectional view of a solar substrate when bending according to the invention.

For example, a 6 inch 200 μm thick solar substrate of the prior art cannot be bent without cracking. In the invention, the solar substrate can be bent and deforms by forming the structures of the first protrusions 102, second protrusions 122, first recess regions 104 and second recess regions 124 thereon. Please refer to FIG. 6A. FIG. 6A illustrates a cross sectional view of a solar substrate when bending according to the invention. As shown in FIG. 6A, when the solar substrate loads an external force, the said structures of the first protrusions 102, second protrusions 122, first recess regions 104 and second recess regions 124 can disperse the force so that the solar substrate may deform without cracking. Additionally, the invention can be integrated with the manufacturing process of the solar cell and so as to maximize the value of the solar cell.

Figure 6B:
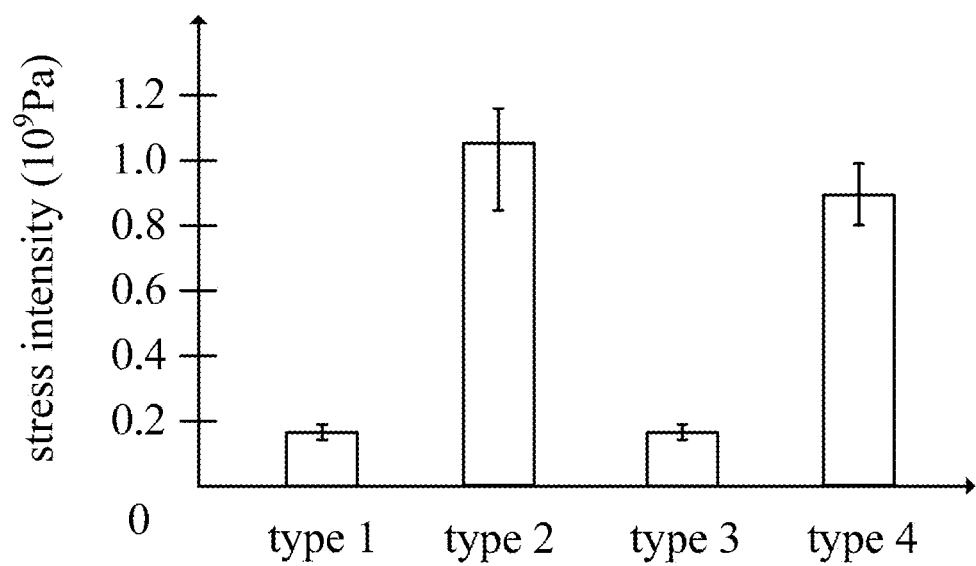
FIG. 6B illustrates real data about maximum stresses can be endured by protrusion of solar substrates according to the invention.

Please refer to FIG. 6B. FIG. 6B illustrates a table of obtained by actual measured maximum stresses can be endured by the solar substrates that with or without the protrusion formed thereon. As shown in FIG. 6B, type 1 represents a single-crystal silicon substrate without the first protrusions 102. Type 2 represents a single-crystal silicon substrate comprising the first protrusions 102 and the second protrusion 122 on the tension bearing surface and compression surface. Type 3 represents a single-crystal silicon substrate comprising the second protrusion 122 on the compression surface. Type 4 represents a single-crystal silicon substrate comprising the first protrusions 102 on the tension bearing surface. According to the FIG. 6B, if the tension bearing surface comprises the first protrusions 102, greater stress can be endured by the solar substrate in comparison with the solar substrate without the protrusions formed thereon. Accordingly, the adverse influence occurred by the external stress to the solar substrate can be moderate while the tension bearing surface and the compression surface of the solar substrate both has the plurality of first protrusions 102 and second protrusions 122 formed thereon.

To sum up, the invention of the solar substrate with high fracture strength can endure a greater stress without cracking. Compared to the prior art, the solar substrate with high fracture strength can endure external force or stress so as to avoid fracturing. Accordingly, the invention of the solar substrate can improve the yield rate thereof so as to avoid the unnecessary waste of materials.

It worth a mention that the present application claims priority from Taiwan Patent Application No. 100104420, filed Feb. 10, 2011, the contents of which are hereby incorporated by reference in their entirety for all purposes.

With the example and explanations above, the features and spirits of the present invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A solar substrate with high fracture strength, comprising:
    an upper surface having a plurality of first protrusions and a plurality of first recess regions formed thereon, each of the plurality of first recess regions being formed on a surrounding of the plurality of first protrusions;
    a lower surface having a plurality of second protrusions and a plurality of second recess regions formed thereon, each of the plurality of second recess regions being formed on a surrounding of the plurality of second protrusions;
    wherein the plurality of first and second recess regions have flat surfaces, and
    wherein the plurality first recess regions on the upper surface are directly opposite the plurality second recess regions on the lower surface.

2. The solar substrate of claim 1, wherein the upper surface is under tension.

3. The solar substrate of claim 1, wherein the solar substrate is an amorphous substrate.

4. The solar substrate of claim 1, wherein the solar substrate is a single-crystal substrate or a polycrystalline substrate.

5. The solar substrate of claim 4, wherein the single-crystal substrate is a single-crystal silicon substrate.

6. The solar substrate of claim 1, wherein each of the first protrusions is a nano pillar or a nano needle.

7. The solar substrate of claim 6, wherein the top distances of the neighbor nano pillars or the nano needles range from about 10 nm to 100 nm.

8. The solar substrate of claim 6, wherein the plurality of nano pillars or the nano needles are manufactured by an electrochemical etching process.

9. The solar substrate of claim 1, wherein the solar substrate is manufactured by glass, silicon, germanium, carbon, aluminum, gallium nitride, gallium arsenide, gallium phosphide, aluminum nitride, sapphire, spinel, aluminum oxide, silicon carbide, zinc oxide, magnesium oxide, lithium aluminum dioxide or lithium gallium dioxide.

10. The solar substrate of claim 1, wherein the lower surface is under compression.

11. The solar substrate of claim 1, wherein the solar substrate is a p-type semiconductor layer having an n-type semiconductor layer formed thereon.

12. A method for increasing the fracture strength of a solar substrate, comprising the following steps:

preparing a solar substrate, the solar substrate having an upper surface and a lower surface, the upper surface being under tension and the lower surface being under depression;

forming a plurality of first protrusions on the upper surface of the solar substrate; and forming a plurality of first recess regions on the upper surface of the solar substrate, each of the plurality of first recess regions being formed on a surrounding of the plurality of first protrusions;

forming a plurality of second protrusions on the lower surface of the solar substrate;

forming a plurality of second recess regions on the lower surface of the solar substrate, each of the plurality of second recess regions being formed on a surrounding of the plurality of second protrusions; and wherein the plurality of first and second recess regions have flat surfaces, and wherein the plurality of first recess regions on the upper surface are directly opposite the plurality of second recess regions on the lower surface.

* * * * *